United States Patent [19]

Aimoto

[11] Patent Number: 5,521,877
[45] Date of Patent: May 28, 1996

[54] SERIAL RANDOM ACCESS MEMORY DEVICE CAPABLE OF REDUCING PEAK CURRENT THROUGH SUBWORD DATA REGISTER

[75] Inventor: Yoshiharu Aimoto, Tokyo, Japan

[73] Assignee: NEC Corporation, Tokyo, Japan

[21] Appl. No.: 288,248

[22] Filed: Aug. 9, 1994

[30] Foreign Application Priority Data

Aug. 9, 1993 [JP] Japan .................................. 5-197173

[51] Int. Cl.$^6$ ............................................. G11C 8/00
[52] U.S. Cl. ............... 365/230.05; 365/227; 365/230.03; 365/230.09; 365/240; 365/189.12
[58] Field of Search ........................ 365/189.04, 219, 365/220, 221, 227, 230.03, 230.05, 230.09, 239, 240, 189.12, 230.06

[56] References Cited

U.S. PATENT DOCUMENTS

| | | | |
|---|---|---|---|
| 5,001,672 | 3/1991 | Ebbers et al. | 365/230.05 |
| 5,193,076 | 3/1993 | Houston | 365/233.5 |
| 5,305,279 | 4/1994 | Park et al. | 365/230.03 |
| 5,319,603 | 6/1994 | Watanabe et al. | 365/230.05 |
| 5,343,425 | 8/1994 | Saito et al. | 365/189.01 |
| 5,371,714 | 12/1994 | Matsuda et al. | 365/230.03 |
| 5,379,263 | 1/1995 | Ogawa et al. | 365/230.04 |
| 5,394,172 | 2/1995 | McLaury | 345/200 |

FOREIGN PATENT DOCUMENTS 4195886  7/1992  Japan .

OTHER PUBLICATIONS

Syoji Ishimoto et al, "Special Application Memories", *1985 IEEE International Solid-State Circuits Conference*, pp. 38 and 39, Feb. 13, 1985.

*Primary Examiner*—David C. Nelms
*Assistant Examiner*—Andrew Q. Tran
*Attorney, Agent, or Firm*—Sughrue, Mion, Zinn, Macpeak & Seas

[57] ABSTRACT

In a semiconductor memory device comprising a plurality of memory cells which are arranged on a cell area defined by a first number of column signal lines and a second number of row signal lines, a row decoder produces a row selection signal through one of the second number of row signal lines. A serial access section includes a data register and serially accesses a part of the plurality of memory cells arranged along the one end of the second number of row signal lines. The plurality of memory cells are divided into a plurality of cell blocks. The data register is divided into a plurality of subword data registers each of which corresponds to each of the plurality of cell blocks. The serial access section accesses the plurality of cell blocks, in order, at a predetermined interval. Each of the plurality of subword data registers stores subword data in each of the plurality of cell blocks, in order, at the predetermined interval.

4 Claims, 4 Drawing Sheets

PRIOR ART

SERIAL RANDOM ACCESS MEMORY DEVICE CAPABLE OF REDUCING PEAK CURRENT THROUGH SUBWORD DATA REGISTER

BACKGROUND OF THE INVENTION

This invention relates to a semiconductor memory device capable of carrying out a random access operation and a serial access operation. Such a semiconductor memory device is particularly useful in a data processing system comprising a microprocessor.

As an example of a semiconductor memory device, a dynamic random access memory device is described in an article which is published by Syoji Ishimoto et al under the title of "SPECIAL APPLICATION MEMORIES" in "1985 IEEE International Solid-State Circuits Conference", pages 38 and 39, Feb. 13, 1985. Such a dynamic random access memory device is used as a memory device for a microprocessor in a data processing system. Generally, the dynamic random access memory device comprises a plurality of memory cells which are arranged on a cell area defined by a plurality of column signal lines and a plurality of row signal lines, a column decoder, a row decoder, a random access section, and a serial access section. The plurality of column signal lines are connected to a plurality of sense amplifiers, respectively. The random access section is for carrying out a random access operation for accessing at least one of the plurality of memory cells at random in cooperation with the column decoder and the row decoder. The serial access section is for carrying out a serial access operation for serially and collectively accessing a part of the plurality of memory cells, in cooperation with the row decoder, those are arranged along one of the plurality of row signal lines.

With regard to a readout operation by the random access section, at least one item of data is read on at least one of the plurality of column signal lines, and amplified into random readout data by the sense amplifier which is connected to the above-mentioned one of the plurality of column signal lines. The random access section transfers the random readout data as random access data to an outer unit, such as a central processing unit of the microprocessor. With regard to the readout operation by the serial access section, serial data are read on the plurality of column signal lines at a time and amplified into serial readout data by the plurality of sense amplifiers, at a time, which are connected to the plurality of column signal lines, respectively. The serial access section transfers the serial readout data as serial access data to the outer unit.

Although the data processing speed of the microprocessor is on an upward trend, it is restricted by an access speed of the dynamic random access memory device. The access speed of the dynamic random access memory device is influenced by the data transfer time of the random or serial access data. In other words, if the data transfer time can be reduced, it is possible to increase the data processing speed. In order to increase the data processing speed, various improvements have been made on dynamic random access memory devices. For example, a data register is combined with the serial access section for temporarily storing the serial readout data in order to increase the access speed. Such a dynamic random access memory device will be called a first type for convenience.

In such a first type, although the access speed can be increased by the use of the data register, the data register causes the following problem in the serial access operation. Namely, a high peak current momentarily flows through the dynamic random access memory device. This is because the serial access section collectively activates the part of the plurality of memory cells arranged along one of the plurality of row signal lines. This means that all of the plurality of sense amplifiers connected to the plurality of column signal lines are put into an active state at one time, and that the serial readout data are collectively stored into the data register.

In order to solve the above-mentioned problem, a semiconductor memory device of another type is described in Japanese Unexamined Patent Publication Tokkai Hei 4-195886, namely, 195886/1992. Such a semiconductor memory device will be called a second type. In the second type, the data register is divided into first and second partial data registers. The first partial data register is for storing a first half of the serial readout data held in one part of the plurality of memory cells, while the second partial data register is for storing a second half of the serial readout data held in the other part of the plurality of memory cells. The first and the second halves of the serial readout data are time divisionally stored into the first and the second partial data registers. In other words, the first half of the serial readout data are stored into the first partial data register at a first time. At a second time, delayed from the first time, the second half of the serial readout data are stored into the second partial data register. As a result, the peak current caused by the data register is reduced by half relative to the first type.

However, the problem of the peak current caused by the plurality of sense amplifiers is not yet solved in the second type. This is because all of the plurality of sense amplifiers connected to the plurality of column signal lines are put into the active state at one time.

SUMMARY OF THE INVENTION

It is therefore an object of this invention to provide a semiconductor memory device which is capable of reducing a peak current in a serial access operation.

Other objects of this invention will become clear as the description proceeds.

On describing the gist of this invention, it is possible to understand that a semiconductor memory device is capable of carrying out a random access operation and a serial access operation, and comprises a plurality of memory cells which are arranged on a cell area defined by a first number of column signal lines and a second number of row signal lines, a row decoder for producing a row selection signal through one of the second number of row signal lines to select a part of the plurality of memory cells those are arranged along the one of the second number of row signal lines, and serial access means connected to one ends of the first number of column signal lines and including a data register for serially accessing the part of the plurality of memory cells. The data register temporarily stores serial data in the serial access operation.

According to an aspect of this invention, the plurality of memory cells are divided into a plurality of cell blocks. The data register is divided into a plurality of subword data registers each of which corresponds to each of the plurality of cell blocks for storing subword data in each of the plurality of cell blocks. The serial access means accesses the plurality of cell blocks, in order, at a predetermined interval. The plurality of subword data registers store the subword data, in order, at the predetermined interval.

DESCRIPTION OF THE PREFERRED EMBODIMENT

Figure 1:
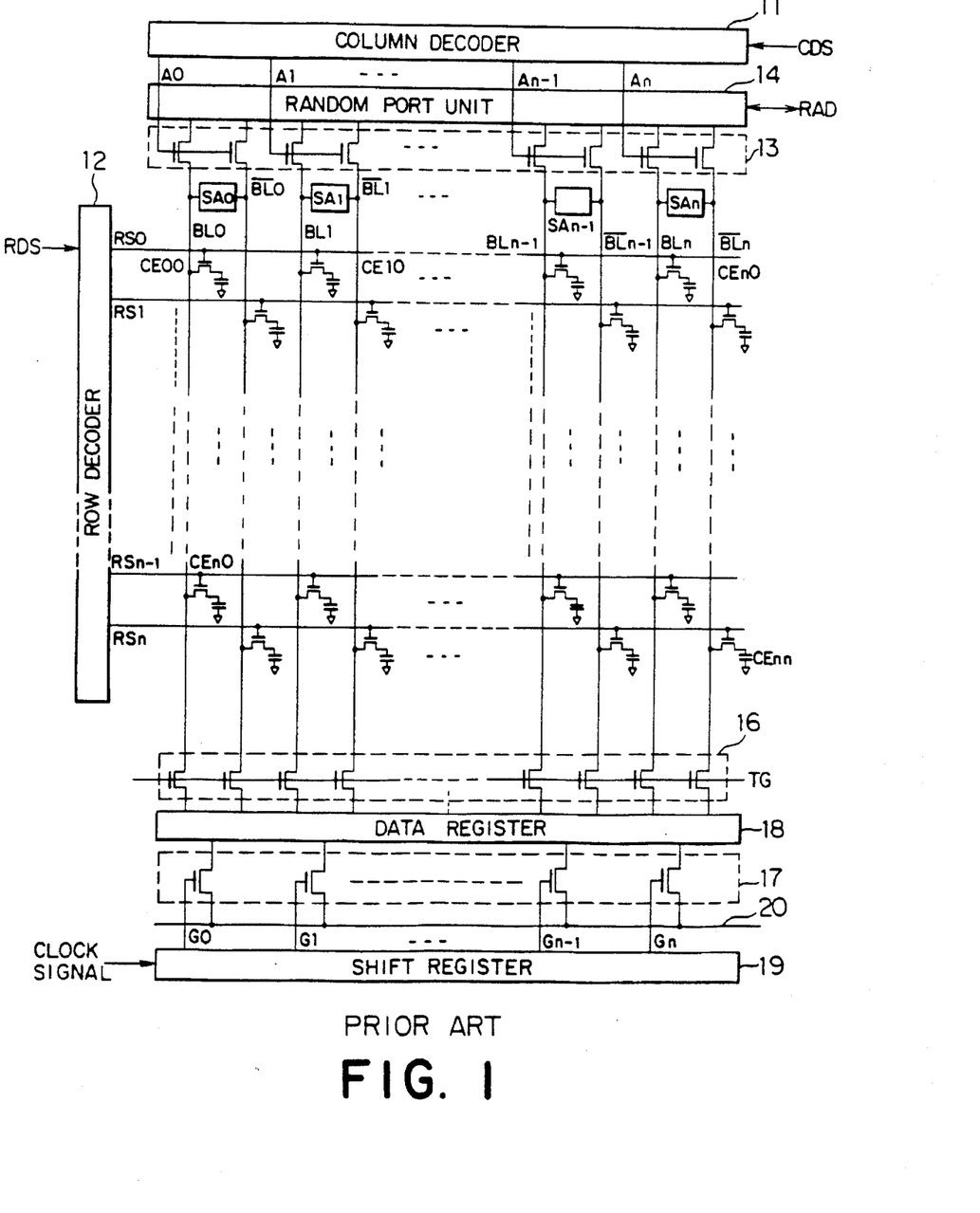
FIG. 1 shows a schematic block diagram of a conventional semiconductor memory device.

Referring to FIG. 1, a conventional semiconductor memory device will be described at first in order to facilitate an understanding of the present invention. The semiconductor memory device is a first type which is described in the background of the invention. In FIG. 1, the semiconductor memory device comprises a plurality of memory cells, a column decoder 11, and a row decoder 12. The plurality of memory cells are arranged on a cell area defined by zeroth through n-th pairs of bit lines which are parallely arranged one another, where n represents a positive integer greater than unity, and which are connected to the column decoder 11 through a column selection circuit 13. The column selection circuit 13 comprises zeroth through n-th pairs of gate elements. The column decoder 11 is connected to the column selection circuit 13 through zeroth through n-th column selection signal lines A0 to An. The zeroth pair of bit lines consists of a zeroth bit line BL0 and a zeroth inversion bit line $\overline{BL0}$. A second pair of bit lines consists of a first bit line BL1 and a first inversion bit line $\overline{BL1}$. Similarly, an (n−1)-th pair of bit lines consists of an (n−1)-th bit line BLn-1 and an (n−1)-th inversion bit line $\overline{BLn-1}$ while the n-th pair of bit lines consists of an n-th bit line BLn and an n-th inversion bit line $\overline{BLn}$. Each of the bit and the inversion bit lines may be called a column signal line. It should be noted here that each of the zeroth through the n-th inversion bit lines $\overline{BL0}$ to $\overline{BLn}$ is a signal line for an inversion signal.

The cell area is further defined by zeroth through n-th row signal lines RS0 to RSn which are parallely arranged one another and which orthogonally cross the zeroth through the n-th pairs of bit lines. One ends of the zeroth through the n-th row signal lines RS0 to RSn are connected to the row decoder 12. Other ends of the zeroth through the n-th row signal lines RS0 to RSn are opened. The row decoder 12 is supplied with an address signal, namely, a row designation signal RDS indicative of one of the zeroth through the n-th row selection signals from an outer unit, such as a central processing unit (not shown) in a microprocessor. Responsive to the row designation signal RDS, the row decoder 12 delivers a row selection signal through one of the zeroth through the n-th row signal lines RS0 to RSn. For example, the row decoder 12 delivers the zeroth row selection signal through the zeroth row signal line RS0, when the row designation signal RDS indicates the zeroth row selection signal.

With regard to the zeroth row signal line RS0, the memory cells are typically depicted at CE00, CE10, and CEn0. These memory cells CE00, CE10, and CEn0 are connected between the zeroth row signal line RS0 and the zeroth bit line BL0, between the zeroth row signal line RS0 and the first bit line BL1, and between the zeroth row signal line RS0 and the n-th bit line BLn, respectively. In other words, the memory cells of (n+1) in number are arranged along the zeroth row signal line RS0. This applies to a second, a fourth, . . . , and an (n−1)-th row signal lines.

With regard to a first row signal line RS1, the memory cells are connected between the first row signal line RS1 and each of the zeroth through the n-th inversion bit lines $\overline{BL0}$ to $\overline{BLn}$. Namely, the memory cells of (n+1) in number are arranged along the first row signal line RS1. This applies to a third, a fifth, . . . , and the n-th row signal lines. Accordingly, a total number of the memory cells is given by 2(n+1)(n+1).

A zeroth sense amplifier SA0 is connected between one ends of the zeroth bit line BL0 and the zeroth inversion bit line $\overline{BL0}$. The zeroth sense amplifier SA0 is for amplifying a signal flowing through the zeroth bit line BL0 and amplifying an inversion signal flowing through the zeroth inversion bit line $\overline{BL0}$. A first sense amplifier SA1 is connected between one ends of the first bit line BL1 and the first inversion bit line $\overline{BL1}$. The first sense amplifier SA1 is for amplifying a signal flowing through the first bit line BL1 and amplifying an inversion signal flowing through the first inversion bit line $\overline{BL1}$. Similarly, an (n−1)-th sense amplifier SAn-1 is connected between one ends of the (n−1)-th bit line BLn-1 and the (n−1)-th inversion bit line $\overline{BLn-1}$ while an n-th sense amplifier SAn is connected between one ends of the n-th bit line BLn and the n-th inversion bit line $\overline{BLn}$.

The one ends of the zeroth bit line BL0 and the zeroth inversion bit line $\overline{BL0}$ are also connected to the zeroth pair of gate elements in the column selection circuit 13. The one ends of the first bit line BL1 and the first inversion bit line $\overline{BL1}$ are connected to a first pair of gate elements in the column selection circuit 13. Similarly, the one ends of the (n−1)-th bit line BLn-1 and the (n−1)-th inversion bit line $\overline{BLn-1}$ are connected to an (n−1)-th pair of gate elements while the one ends of the n-th bit line BLn and the n-th inversion bit line $\overline{BLn}$ are connected to the n-th pair of gate elements. Gate electrodes of the zeroth pair of gate elements are connected to the column decoder 11 through the zeroth column selection signal line A0. Gate electrodes of the first pair of gate elements are connected to the column decoder 11 through the first column selection signal line A1. Similarly, gate electrodes of the n-th pair of gate elements are connected to the column decoder 11 through the n-th column selection signal line An. The zeroth through the n-th pairs of gate elements are connected to a random port unit 14. The column selection circuit 13 and the random port unit 14 collectively serve as a random access section which is for carrying out a random access operation. Briefly, the random access section accesses at least one of the plurality of memory cells at random in cooperation with the column decoder 11 and the row decoder 12.

With regard to a readout operation, the column decoder 11 is supplied with a column designation signal CDS which designates at least one of zeroth through n-th column selection signals. Responsive to the column designation signal CDS, the column decoder 11 produces at least one of column selection signals through at least one of the zeroth through the n-th column selection signal lines A0 to An. For example, the column decoder 11 delivers the zeroth column selection signal through the zeroth column selection signal line A0, when the column designation signal CDS designates the zeroth column selection signal. Let the column designation signal CDS designate the zeroth and a first column selection signals and the row designation signal RDS designate the zeroth row selection signal. In this case, data memorized in the memory cells CE00 and CE10 are read on the zeroth and the first bit lines BL0 and BL1 and are amplified into random readout data by the zeroth and the first sense amplifiers SA0 and SA1. The random readout data are transferred to the random port unit 14 through the zeroth and the first pairs of gate elements in the column selection circuit 13 and further transferred to the outer unit as random access data RAD. Inasmuch as the random access operation is well known in the art, the random access section will not be described any longer.

The semiconductor memory device further comprises a primary transfer gate circuit 16, a secondary transfer gate circuit 17, a data register 18, and a shift register 19. The primary transfer gate circuit 16 comprises gate elements of $2(n+1)$ in number. Each of other ends of each of the zeroth through the n-th bit lines BL0 to BLn and each of other ends of each of the zeroth through the n-th inversion bit lines $\overline{BL0}$ to $\overline{BLn}$ are connected to the data register 18 through each of the gate elements in the primary transfer gate 16. Gate electrodes of each of the gate elements in the primary transfer gate 16 are connected in common to a primary transfer signal line TG. The secondary transfer gate circuit 17 comprises gate elements of $(n+1)$ in number. The data register 18 is connected to a serial read/write bus 20 through the gate elements in the secondary transfer gate circuit 17. Each of gate electrodes in the secondary transfer gate circuit 17 are connected to the shift register 19 through zeroth through n-th gate control signal lines G0 to Gn.

As will later be described, the primary transfer gate circuit 16 is for controlling data transfer between the plurality of memory cells and the data register 18. The shift register 19 is for controlling input and output operation of the data register 18 in response to a clock signal supplied from the outer unit. In other words, the secondary transfer gate circuit 17 carries out data transfer between the data register 18 and the serial read/write bus 20 in response to zeroth through n-th gate control signal supplied from the shift register 19 through the zeroth through the n-th gate control signal lines G0 to Gn. The primary and the secondary transfer gate circuits 16 and 17, the data register 18, the shift register 19, and the serial read/write bus 20 may collectively be called a serial access section.

Figure 2:
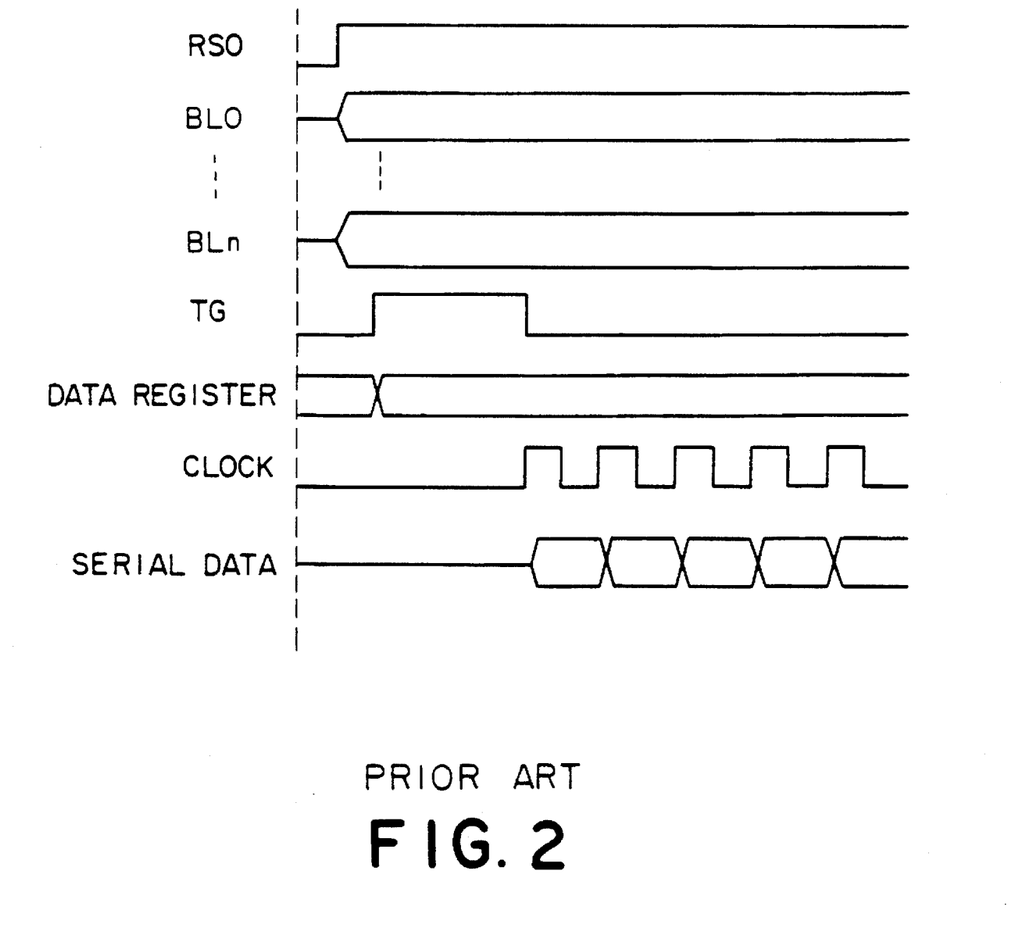
FIG. 2 shows signal waveforms for use in describing a serial readout operation of the semiconductor memory device illustrated in FIG. 1.

Referring to FIG. 2 together with FIG. 1, the description will be made as regards a serial access operation, in particular, a serial readout operation by the serial access section. The row decoder 12 is supplied with the row designation signal RDS which designates one of the zeroth through the n-th row selection signals from the outer unit.

Let the row designation signal RDS designate the zeroth row selection signal. In this event, the row decoder 12 delivers the zeroth row selection signal of a selection level, namely, a logic one value to the zeroth row signal line RS0 as shown in a top line of FIG. 2. Data memorized in the memory cells CE00, CE10, . . . , and CEn0 are read, as zeroth through n-th data, on the zeroth through the n-th bit lines BL0 to BLn, respectively, as shown in second and third lines of FIG. 2. The zeroth through the n-th data are amplified, as zeroth through n-th amplified readout-data, by the zeroth through the n-th sense amplifiers SA0 to SAn at the same time. Subsequently, the primary transfer gate circuit 16 is supplied with the primary transfer signal from the outer unit through the primary transfer signal line TG as shown in a fourth line of FIG. 2.

In this case, all of the gate elements in the primary transfer gate circuit 16 are activated at the same time. As a result, the zeroth through the n-th amplified readout data are collectively transferred to the data register 18 through the primary transfer gate circuit 16 and are stored in the data register 18, as zeroth through n-th stored readout data, as shown in a fifth line of FIG. 2. When the primary transfer signal is stopped, the shift register 19 is supplied with the clock signal from the outer unit as shown in a sixth line of FIG. 2. In synchronism with the clock signal, the shift register 19 delivers the zeroth through the n-th gate control signals, in order, to the secondary transfer gate circuit 17 through the zeroth through the n-th gate control signal lines G0 to Gn, respectively. Thus, the zeroth through the n-th stored readout data are serially transferred, as the serial data, to the serial read/write bus 20 through the secondary transfer gate circuit 17 as shown in a bottom line of FIG. 2. Such a serial readout operation applies to the first through the n-th row signal lines RS1 to RSn. Furthermore, a serial write-in operation is carried out in an inverse manner relative to that mentioned above. Briefly, serial write-in data are supplied to the serial read/write bus 20 from the outer unit and stored, as stored data, in the data register 18 at the same time through the secondary transfer gate circuit 17. The stored data are memorized, at the same time, in the memory cells which are arranged along one of the zeroth through the n-th row signal lines RS0 to RSn.

It should be noted here that the zeroth through the n-th data of the zeroth through the n-th bit lines BL0 to BLn are amplified by the zeroth through the n-th sense amplifiers SA0 to SAn at the same time and that the zeroth through the n-th amplified readout data are collectively transferred to the data register 18. This applies to the data of the zeroth through the n-th inversion bit lines $\overline{BL0}$ to $\overline{BLn}$. This means that the semiconductor memory device has a high peak current caused by the zeroth through the n-th sense amplifiers SA0 to SAn and by the data register 18. Such a disadvantage applies to the serial write-in operation.

Figure 3:
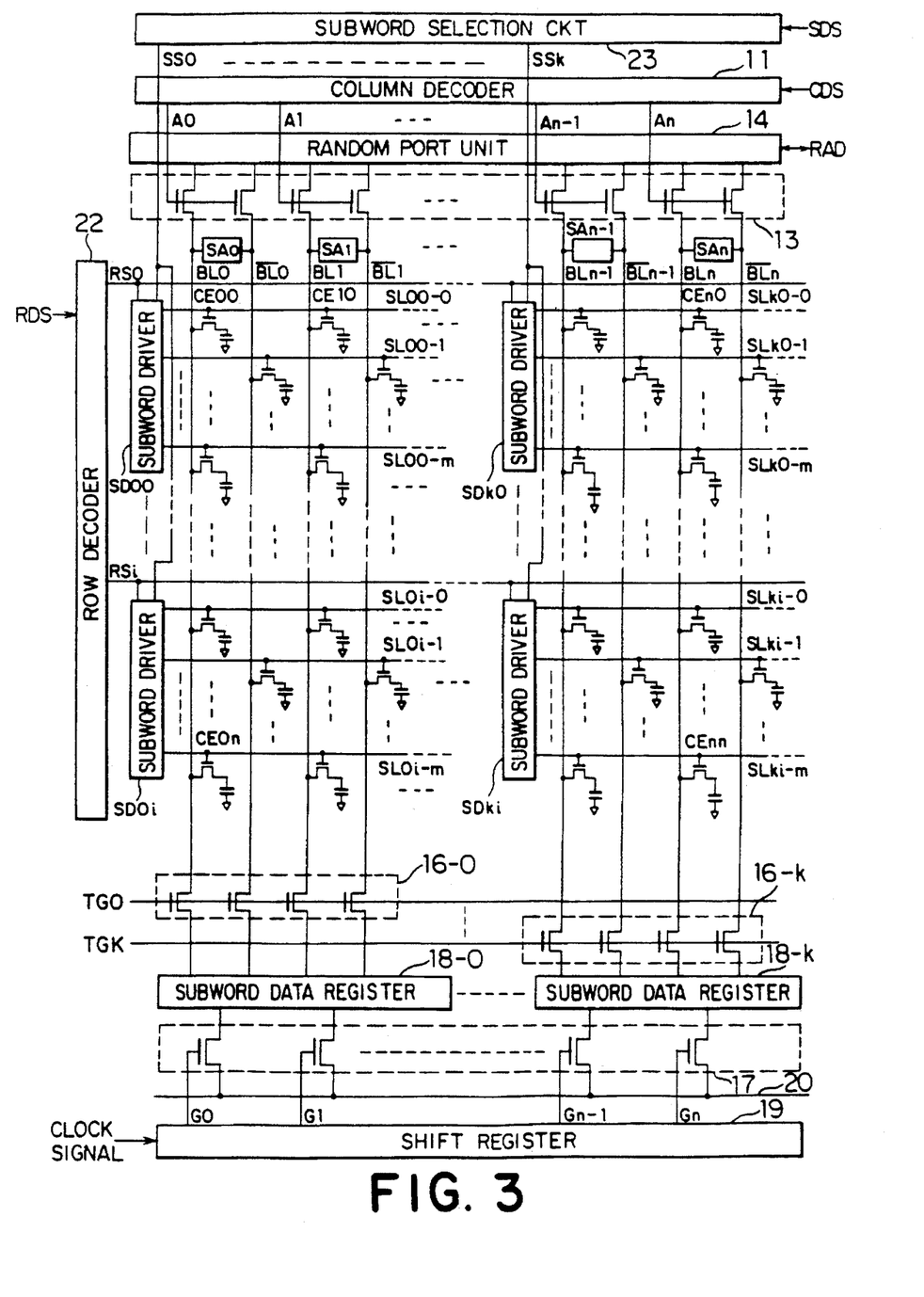
FIG. 3 shows a schematic block diagram of a semiconductor memory device according to a preferred embodiment of this invention.

Referring to FIG. 3, the description will be made regarding a semiconductor memory device according to a preferred embodiment of this invention. The semiconductor memory device comprises similar parts designated by like reference numerals, and a row decoder 22 used in place of the row decoder 12. As will become clear as the description proceeds, the semiconductor memory device is characterized by a serial access section. The plurality of memory cells are divided into a plurality of cell blocks. The number of cell blocks is given by k×i where k and i represent first and second integers both of which are greater than 1. Strictly speaking, the plurality of memory cells are divided into k in number in a row direction, and are divided into i in number in a column direction. In other words, the plurality of memory cells are divided into zeroth through k-th blocks in the row direction, and are divided into zeroth through i-th blocks in the column direction. As a result, the zeroth through the n-th pairs of bit lines are divided into zeroth through k-th groups. In the example being illustrated, each of the zeroth through the k-th groups consists of two pairs of bit lines. For example, the zeroth group consists of the zeroth and the first bit lines BL0 and BL1 and the zeroth and the first inversion bit lines $\overline{BL0}$ and $\overline{BL1}$. In the example, only four cell blocks are partially illustrated. A first one of the four cell blocks is located at an upper left of the cell area. A second one of the four cell blocks is located at an upper right of the cell area. A third one of the four cell blocks is located at a lower left of the cell area while a fourth one of the four cell blocks is located at a lower right of the cell area. In addition, a total number of the zeroth through the n-th bit lines BL0 to BLn and the zeroth through the n-th inversion bit lines $\overline{BL0}$ to $\overline{BLn}$ is given by $2(n+1)$ and may be called a first number.

The semiconductor memory device further comprises zeroth through k-th partial transfer gate circuits 16-0 to 16-k which correspond to the zeroth through the k-th groups of the zeroth through the n-th pairs of bit lines. This is equivalent to the case that the primary transfer gate circuit 16 (FIG. 1) is divided into k in number. The zeroth partial transfer gate circuit 16-0 comprises gate elements of four in number which are connected to the zeroth and the first bit lines BL0 and BL1 and the zeroth and the first inversion bit lines $\overline{BL0}$ and $\overline{BL1}$. This applies to a first through the k-th partial transfer gate circuits. The zeroth through the k-th partial transfer gate circuits 16-0 to 16-k are controlled by zeroth through k-th primary transfer signals supplied through zeroth through k-th primary transfer signal lines TG0 to TGk, respectively. As will later be described, the zeroth through the k-th primary transfer signals are supplied from the outer unit, in order, at a predetermined interval T1. Zeroth through k-th subword data registers 18-0 to 18-k are connected to the zeroth through the k-th partial transfer gate circuits 16-0 to 16-k, respectively. This means that the data register 18 illustrated in FIG. 1 is divided into k in number. The zeroth through the k-th subword data registers 18-0 to 18-k are connected to the shift register 19 through the secondary transfer gate circuit 17.

The row decoder 22 produces zeroth through i-th row selection signals through zeroth through i-th row signal lines RS0 to RSi, respectively, in response to the row designation signal RDS supplied from the outer unit. A total number of the zeroth through the i-th row signal lines RS0 to RSi is equal to i in number and may be called a second number. The semiconductor memory device further comprises subword drivers of k×i in number. The subword drivers are in one-to-one correspondence to the plurality of cell blocks. In the example, the subword drivers of four in number are typically depicted at SD00, SDk0, SD0i, and SDki. Each of the subword drivers SD00, SDk0, SD0i, and SDki corresponds to each of the four cell blocks mentioned above. A subset of the subword drivers, of k in number, are connected to the zeroth row signal line RS0 because a subset of the cell blocks, also of k in number, are arranged along the zeroth row signal line RS0. Similarly, a subset of the subword drivers, of k in number are connected to the i-th row signal line RSi for the same reason as mentioned above. This applies to first through (i−1)-th row signal lines. This is the reason why a total number of the subword drivers is given by k×i.

Zeroth through m-th subword signal lines are connected to each of the subword drivers, where m represents a third integer greater than 1. For example, one end of each of the zeroth through m-th subword signal lines SL00-0 to SL00-m is connected to the subword driver SD00. The other end of each of the zeroth through the m-th subword signal lines SL00-0 to SL00-m are unconnected. Similarly, one end of each of the zeroth through m-th subword signal lines SLk0-0 to SLk0-m is connected to the subword driver SDk0. The other end of each of the zeroth through the m-th subword signal lines SLk0-0 to SLk0-m are unconnected. The subword driver SD0i is connected to one end of each of the zeroth through m-th subword signal lines SL0i-0 to SL0i-m, while the subword driver SDki is connected to one end of each of the zeroth through m-th subword signal lines SLki-0 to SLki-m. The other end of each of the zeroth through the m-th subword signal lines SL0i-0 to SL0i-m and SLki-0 to SLki-m are unconnected.

With regard to the cell block corresponding to the subword driver SD00, the zeroth through the m-th subword signal lines SL00-0 to SL00-m orthogonally intersect, in insulated condition, the zeroth and the first bit lines BL0 and BL1 and the zeroth and the first inversion bit lines $\overline{BL0}$ and $\overline{BL1}$. In the example, the memory cell CE00 is located at an intersection between the zeroth bit line BL0 and the zeroth subword signal line SL00-0, and is connected between the zeroth bit line BL0 and the zeroth subword signal line SL00-0. The memory cell CE10 is located at an intersection between the first bit line BL1 and the zeroth subword signal line SL00-0 and is connected between the first bit line BL1 and the zeroth subword signal line SL00-0. This applies to second, fourth, ..., and the m-th subword signal lines. In a first subword signal line SL00-1, two memory cells are connected between the zeroth inversion bit line $\overline{BL0}$ and the first subword signal line SL00-1 and between the first inversion bit line $\overline{BL1}$ and the first subword signal line SL00-1. This applies to third, fifth, ..., and (m−1)-th subword signal lines. Under the circumstances, the cell block corresponding to the subword driver SD00 comprises the memory cells of 2(m+1) in number. This applies to other cell blocks. It should be noted here that the subword driver SD00 can designate one of the zeroth through the m-th subword signal lines SL00-0 to SL00-m in response to the zeroth row selection signal. This applies to all of the subword drivers which are connected to the zeroth row signal line RS0, and applies to other subword drivers which are connected to each of the first through the i-th row signal lines.

In order to select one of the subword drivers, the semiconductor memory device further comprises a subword selection circuit 23. The subword selection circuit 23 is supplied with a subword designation signal SDS from the outer unit, and delivers zeroth through k-th subword selection signals, in order, at the predetermined interval T1, via zeroth through k-th subword selection signal lines SS0 to SSk. The zeroth subword selection signal line SS0 is connected to the subword drivers of i in number, which are located at lefthand side in the column direction and which include the subword drivers SD00 and SD0i. Similarly, the k-th subword selection signal line SSk is connected to the subword drivers of i in number, which are located at righthand side in the column direction and which include the subword drivers SDk0 and SDki. This applies to first through (k−1)-th subword selection signal lines.

Figure 4:
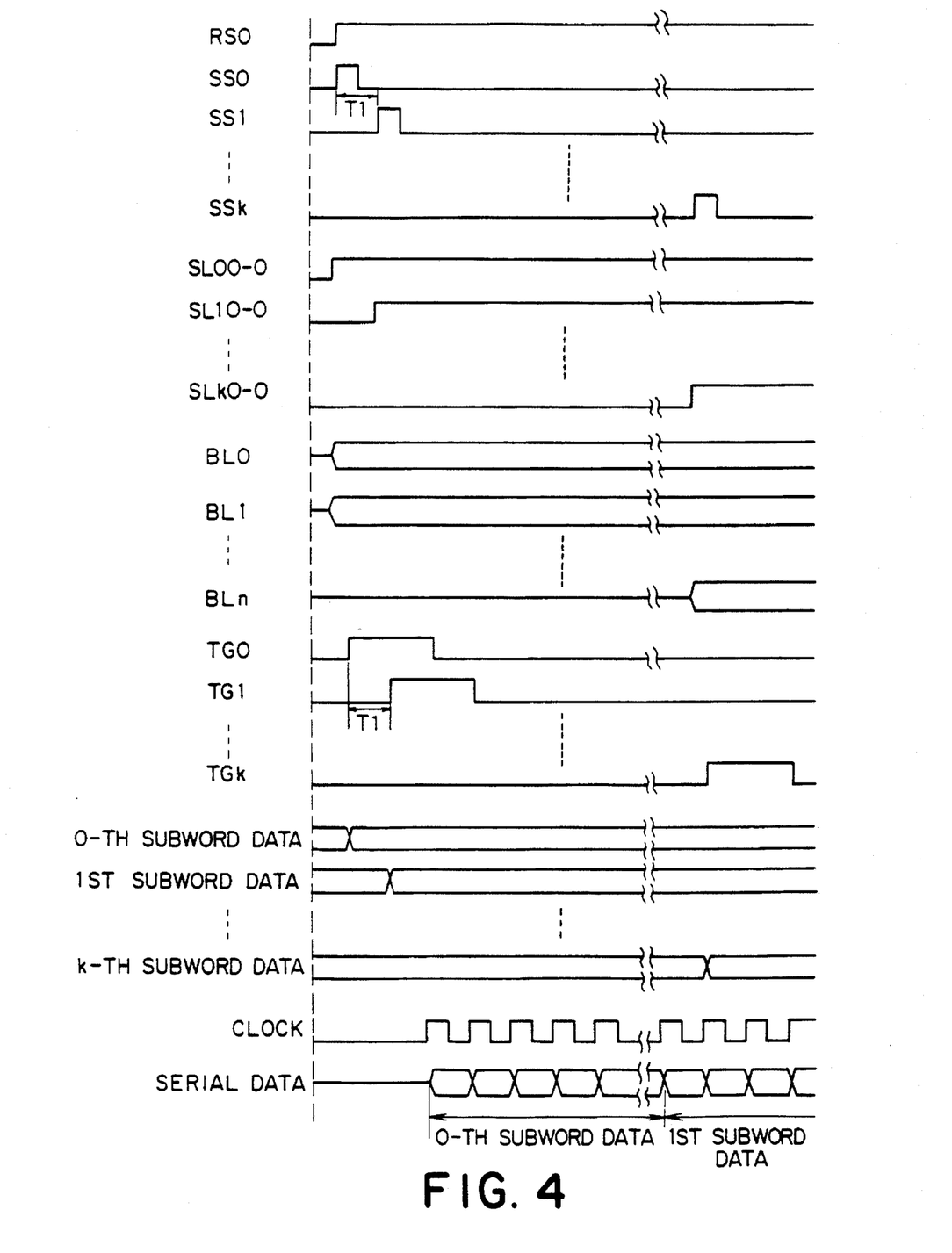
FIG. 4 shows signal waveforms for use in describing a serial readout operation of the semiconductor memory device illustrated in FIG. 3.

Referring to FIG. 4 together with FIG. 3, the description will proceed to the serial readout operation. Let the row designation signal RDS supplied from the outer unit designate the zeroth row selection signal which designates the zeroth subword signal lines SL00-0 or SLk0-0 in the cell blocks arranged along the zeroth row signal line RS0. For convenience, the cell blocks arranged along the zeroth row signal line RS0 are called zeroth through k-th cell blocks hereinafter, The zeroth cell block is connected to the subword driver SD00, while the k-th cell block is connected to the subword driver SDk0.

Thus, row decoder 22 produces, in response to the row designation signal RDS, the zeroth row selection signal through the zeroth row signal line RS0 as shown in a top line of FIG. 4. Simultaneously, the subword selection circuit 23 is supplied with the subword designation signal SDS and delivers the zeroth through the k-th subword selection signals, in order, at the predetermined interval T1 via the zeroth through the k-th subword selection signal lines SS0 to SSk as shown in the second through fourth lines of FIG. 4. Responsive to the zeroth row selection signal and the zeroth subword selection signal, the subword driver SD00 causes the zeroth subword signal line SD00-0 to have a selection level (namely, a logic value of one) value as shown in the fifth line of FIG. 4. As shown in the sixth line of FIG. 4, a next subword driver (not shown) connected to a first cell block and a first subword selection signal line SS1 is supplied with the zeroth row selection signal and with the first subword selection signal after a lapse of the predetermined interval T1. The next subword driver, thereby, causes the zeroth subword selection signal line SL10-0 to have the logic one value. Responsive to the k-th subword selection signal and the zeroth row selection signal, the subword driver SDk0 connected to the k-th cell block causes the zeroth subword signal line SLk0-0 to have the logic one value, as shown in the seventh line of FIG. 4.

When the zeroth subword signal line SL00-0 has the logic one value, data memorized in the memory cells CE00 and CE10 are read, as readout data, on the zeroth and the first bit lines BL0 and BL1, respectively (as shown in the eighth and ninth lines of FIG. 4). These readout data are amplified by the zeroth and the first sense amplifiers SA0 and SA1 as amplified readout data. This applies to the first through the k-th cell blocks. Namely, data are read from the first through the k-th cell blocks, in order, in synchronism with the first through the k-th subword selection signals. In the tenth line of FIG. 4, readout data read on the n-th bit line BLn from the memory cell CEn0 is illustrated.

As shown in the eleventh through thirteenth lines of FIG. 4, the outer unit further supplies the zeroth through the k-th primary transfer signals to the zeroth through the k-th partial transfer gate circuits 16-0 to 16-k, respectively, at the predetermined interval T1 through the zeroth through the k-th primary transfer signal lines TG0 to TGk. Supplied with the zeroth primary transfer signal, the zeroth partial transfer gate circuit 16-0 transfers the amplified readout data of the zeroth and the first bit lines BL0 and BL1 to the zeroth subword data register 18-0. Thus, the amplified readout data read from the zeroth cell block are stored, as zeroth subword data, into the zeroth subword data register 18-0 as shown in the fourteenth line of FIG. 4. After a lapse of the predetermined interval T1, the amplified readout data read from the first cell block are stored, as first subword data, into the first subword data register 18-1 as shown in a fifteenth line of FIG. 4. Similarly, the amplified readout data read from the k-th cell block are stored, as k-th subword data, into the k-th subword data register 18-k in synchronism with the k-th primary transfer signal as shown in a sixteenth line of FIG. 4. Thus, the data memorized in the zeroth through the k-th cell blocks are read out at the predetermined interval T1 and amplified in each of the zeroth through the k-th cell blocks and then stored into each of the zeroth through the k-th subword data registers 18-0 to 18-k in order at the predetermined interval T1.

As shown in the seventeenth line of FIG. 4, the shift register 19 is supplied with the clock signal from the outer unit and delivers the zeroth through the n-th gate control signals in synchronism with the clock signal through the zeroth through the n-th gate control signal lines G0 to Gn. Responsive to the zeroth through the n-th gate control signals, the zeroth through the k-th subword data are transferred, as serial data, from the zeroth through the k-th subword data registers 18-0 to 18-k, in order, to the read/write bus 20 through the secondary transfer gate circuit 17 as shown in a bottom line of FIG. 4.

As apparent from the above description, the readout operation is carried out by the serial access section in each of the zeroth through the k-th cell blocks at the predetermined interval T1. The readout data read from the zeroth through the k-th cell blocks are time divisionally amplified in each of the zeroth through the k-th cell blocks. Furthermore, the amplified readout data of each of the zeroth through the k-th cell blocks are time divisionally stored into the zeroth through the k-th data registers 18-0 to 18-k as the zeroth through the k-th subword data at the predetermined interval T1. The zeroth through the k-th subword data are serially transferred to the outer unit as the serial data. Under the circumstances, it is possible to reduce the peak current flowing through the semiconductor memory device.

While this invention has thus far been described in conjunction with a preferred embodiment thereof, it will readily be possible for those skilled in the art to put this invention into practice in various other manners. For example, although the plurality of memory cells are equally divided into a plurality of cell blocks, the plurality of memory cells may be divided at random in number.

What is claimed is:

1. A serial random access memory device comprising:

a plurality of memory cells, a row decoder for producing a row selection signal, a plurality of column signal lines, a plurality of row signal lines, and a serial access means;

said plurality of memory cells being disposed at intersections of said plurality of column signal lines and said plurality of row signal lines;

said plurality of memory cells being divided into a plurality of cell blocks;

said row decoder being connected to said plurality of row signal lines whereby said row decoder produces said row selection signal through one of said plurality of row signal lines to select said memory cells arranged thereon;

said serial access means comprising a data register and being connected to each of said plurality of column signal lines;

said data register being divided into a plurality of subword data registers;

each one of said subword data registers having a respective partial transfer gate circuit which (1) receives a primary transfer signal over a unique primary transfer signal line and (2) in response, transfers data to said one of said subword data registers;

each of said cell blocks corresponding to and operationally coupled with a corresponding one of said partial transfer gates;

said serial access means further comprising:
        a subword selection circuit for producing a subword selection signal; and
        a plurality of subword drivers;

said subword selection circuit being functionally coupled with each of said subword drivers;

each of said subword drivers being connected to a respective cell block of said plurality of cell blocks to select said respective cell block in response to said subword selection signal;

said subword selection circuit selecting, in a predetermined order and at a predetermined time interval, each of said cell blocks associated with said row selection signal; and said primary transfer signal being provided, in said predetermined order and at said predetermined time interval, over each said unique primary transfer signal line.

2. A serial random access memory device as claimed in claim 1, further comprising random access means connected to said plurality of column signal lines whereby at least one of said plurality of memory cells may be accessed at random.

3. A serial random access memory device comprising:

column signal lines, row signal lines, subword signal lines, subword selection signal lines;

primary transfer signal lines, a serial read/write bus, memory cells, disposed at intersections of said column signal lines and said subword signal lines, subword drivers, disposed at intersections of said subword selection signal lines and said row signal lines, said subword drivers belonging to (1) respective subword driver rows defined by said row signal lines, and (2) respective subword driver columns, defined by said subword selection signal lines, a row decoder, connected to each of said row signal lines, and producing a row selection signal through one of said row signal lines to select one of said subword driver rows, a subword selection circuit, connected to each of said subword selection signal lines, and producing a subword selection signal through one of said subword selection signal lines to select one of said subword driver columns, partial transfer gate circuits, each of which (1) is connected to said column lines of a different one of said subword driver columns, (2) corresponds to said different one of said subword driver columns, and (3) receives a respective primary transfer signal over a different one of said primary transfer signal lines, and subword data registers, each of which is connected to said column lines of a corresponding one of said partial transfer gate circuits;

wherein each of said subword drivers is connected to a corresponding subset of said subword signal lines, and defines a corresponding cell block of said memory cells;

wherein said selected one of said subword driver rows and said selected one of said subword driver columns indicate a selected one of said subword drivers;

wherein said selected one of said subword drivers enables a transfer of data for said memory cells of said corresponding cell block;

wherein said transfer of said data occurs via said column signal lines of said selected one of said subword drivers, through said corresponding one of said partial transfer gate circuits, and to said corresponding one of said subword data registers;

wherein said subword selection circuit selects each of said subword driver columns in a predetermined order, at time instants separated by a predetermined time interval;

wherein said subword selection circuit causes each of said subword drivers in said selected one of said subword driver rows to transfer, in turn, said data to said corresponding one of said partial transfer gate circuits; and wherein said primary transfer signal is provided over each of said primary transfer signal lines in said predetermined order, at time instants separated by said predetermined time interval, to cause each of said partial transfer gate circuits to transfer, in turn, said data to said corresponding one of said subword data register.

4. The serial random access memory device as set forth in claim 3, further comprising random access means for randomly accessing one of said memory cells; wherein said random access means is connected to each of said column signal lines.

* * * * *